United States Patent [19]

Imamura

[11] Patent Number: 5,314,844
[45] Date of Patent: May 24, 1994

[54] METHOD FOR DICING A SEMICONDUCTOR WAFER

[75] Inventor: Souichi Imamura, Yokohama, Japan

[73] Assignee: Kabushiki Kaisha Toshiba, Kawasaki, Japan

[21] Appl. No.: 845,945

[22] Filed: Mar. 4, 1992

[30] Foreign Application Priority Data

Mar. 4, 1991 [JP] Japan .................................. 3-062550

[51] Int. Cl.[5] .................. H01L 21/302; H01L 21/304
[52] U.S. Cl. ............................ 437/226; 148/DIG. 28
[58] Field of Search ............................... 437/226, 249;
148/DIG. 28; 257/620, 627

[56] References Cited

U.S. PATENT DOCUMENTS 5,182,233  1/1993  Inoue .................................... 437/226

FOREIGN PATENT DOCUMENTS 0025053  1/1990  Japan .................................. 437/226

Primary Examiner—Olik Chaudhuri
Assistant Examiner—H. Jey Tsai
Attorney, Agent, or Firm—Oblon, Spivak, McClelland, Maier & Neustadt

[57] ABSTRACT

A method of dicing a wafer of III-V compound material without causing chipping and cracks. The method includes the steps of forming a scribe line on a surface of the wafer orthogonal to a crystal plane (011) by means of a scribing method, forming a groove in the semiconductor wafer in parallel to the crystal plane (011) by means of a grinding-cutting method, and breaking the semiconductor wafer along the scribe line and the groove.

9 Claims, 3 Drawing Sheets

DIAMOND SCRIBING METHOD

DIAMOND BLAE METHOD

METHOD FOR DICING A SEMICONDUCTOR WAFER

BACKGROUND OF THE INVENTION

1. Field of the Invention

This invention relates to a method of dicing a semiconductor wafer, and it relates, more particularly, to an improvement in the method of dicing wafers made of a III-V compound semiconductor material.

2. Description of the Prior Art

Recently, semiconductor substrates made of a III-V compound semiconductor material such as GaAs, GaP and InP have been mass-produced for semiconductor devices, in addition to silicon. The substrates made of a III-V compound semiconductor material are weak in mechanical strength as compared to the silicon, and such weakness is overcome technically.

One or a plurality of kinds selected from a group consisting of passive and active elements such as a resistor and transistor are made into an element. A plurality of such elements are fabricated in a wafer of a III-V compound semiconductor material in the same way prepared for a wafer made of silicon.

In the course of production, dicing lines are marked between the boundary lines of chips 3 by using, for instance, a diffusion method. A wafer will be separated to the chips 3 by a specific method.

Of dicing processes, the following three methods are well known in the art. These are the diamond scribing method, the diamond blade method and the dicing saw method. For each method implemented, it is necessary to minimize the distance of a groove between chips 3 in terms of maximum available area and to minimize also the damage to the chips 3, for instance, to prevent so-called chipping 2 that causes a crack and breakage as shown in FIG. 2A.

Among the three methods, each are used according to its specific purpose. In the dicing saw method, the thin wheel, in the tip of which diamond particles are sintered, dices the wafer from the X- and Y-axis directions (see FIG. 2A) in the width of 20-40 μm on the wafer with a high speed of 10,000 to 50,000 rpm. The depth of the groove to be cut can be chosen freely and a complete cut (through-cut) is also possible.

The advantages of the dicing saw method lies in the fact that the method provides a stable width of cut in the groove and a deep groove of cut. Further, there are little cracks or chipping 2 caused, and the cutting takes places at a high speed, and is thus preferable in a mass-production. This dicing saw method is suitable for dicing the wafer having the width of 400 μm through 600 μm.

In the diamond scribing method, a wafer to be processed is fixed by means of a vacuum chuck or static chuck, and the groove of cut is formed by a diamond cutter with a predetermined load from the directions of X- and Y-axes as shown in FIG. 1B. After the depth of cut in the groove is formed at a rather shallow depth of, say, 50 μm, the wafer will be separated into chips 3 by applying a mechanical force by means of a rubber roller or the like. In this method, there is a drawback that the chipping 2 and cracks are likely to occur. Notwithstanding, the apparatus used in this method is simple and inexpensive.

In the diamond blade method similar to the diamond scribing method, the groove of cut is formed at a predetermined position by a diamond cutter with a certain load from the directions of X- and Y-axes. Then, the wafer is usually cut through by moving the blade made from diamond as shown in FIG. 2B.

As shown in FIG. 2A, an orientation flat 6 is usually provided in a circular wafer of a III-V compound semiconductor material. A chip 3 whose typical dimension is 0.3 mm and 0.5 mm of rectangular shape is fabricated in the wafer.

In the diamond scribing method using the cleaving characteristics, there are cases where an incomplete breakage occurs though the width of groove can be made as small as about 40 μm or less. When dicing the wafer of a III-V semiconductor material with this method to obtain chips 3, it is especially hard to cut the chip in a parallel direction with a longer side of the rectangular chip, namely in the direction parallel to a cleaving direction. This will cause a chip pair 1 or a broken chip pair 7 shown in FIG. 1, thus affecting to lower the yield.

In the diamond blade method used to dice the wafer of a III-V semiconductor material as shown in FIG. 3, there are cases where chipping 2 shown in FIG. 2A and FIG. 3 often occurs even though the method can perform to cut through the wafer completely. For this reason, the width of the dicing line should be formed as wide as about 100 μm. This requires the area occupied by a chip 3 to be greater. FIG. 2A, and FIG. 2B show the occurrence of chipping 2. FIG. 3 shows an enlarged view thereof.

SUMMARY OF THE INVENTION

It is therefore an object of a the present invention to provide a method for dicing a wafer of the III-V compound semiconductor material without causing chipping and cracks which attribute to lowering the yield, so that the costly wafer of a III-V compound semiconductor material can be utilized most efficiently.

To achieve the object, there is provided a method for dicing a wafer of III-V compound semiconductor material, the method comprising the steps of: forming a scribe line on a surface of the wafer orthogonal to a crystal plane (011) by means of a scribing method; forming a groove in the semiconductor wafer in parallel to the crystal plane (011) by means of a grinding-cutting method; and breaking the semiconductor wafer along the scribe line and the groove. The grinding-cutting method uses preferably a blade or a wire saw.

Other features and advantages of the present invention will become apparent from the following description taken in conjunction with the accompanying drawings.

DETAILED DESCRIPTION OF THE PREFERRED EMBODIMENTS

Figure 1A:
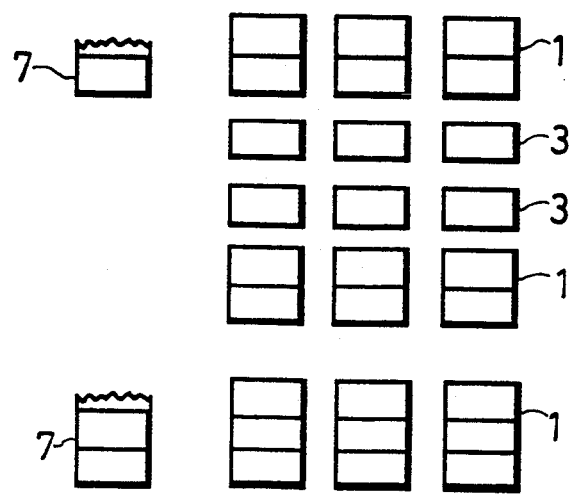
FIG. 1A is a plan view showing a typical result in the separation of chips in a wafer of III-V semiconductor material when a conventional diamond scribing method alone is used.
Figure 1B:
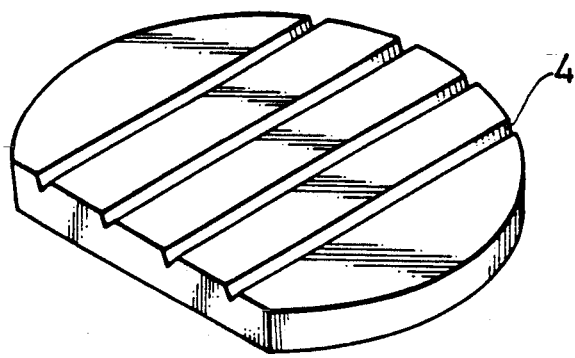
FIG. 1B is a perspective view showing dicing lines formed on the wafer by the diamond scribing method.
Figure 2A:
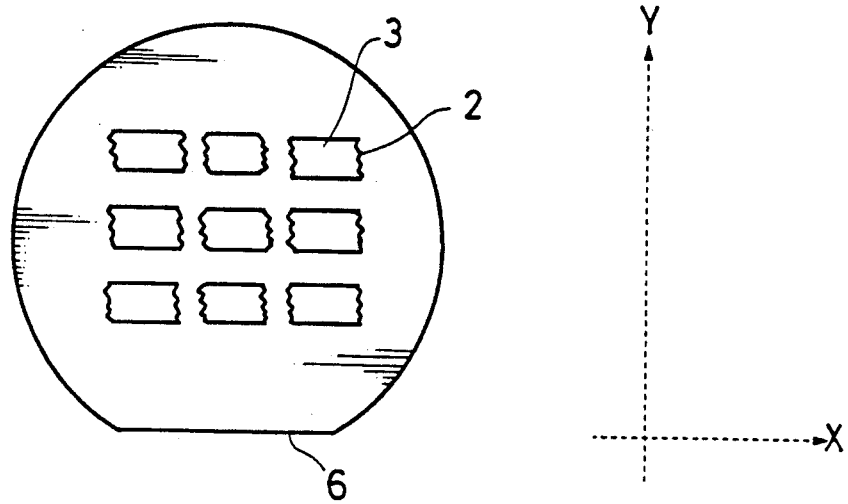
FIG. 2A and FIG. 2B are a plan view and a perspective view, respectively, showing a typical result in the separation of chips in a wafer of III-V semiconductor material when a conventional diamond blade method alone is used.
Figure 2B:
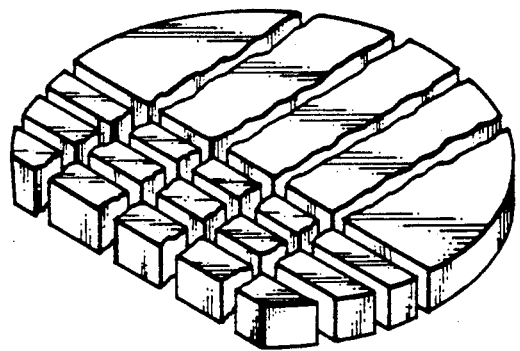
Figure 3:
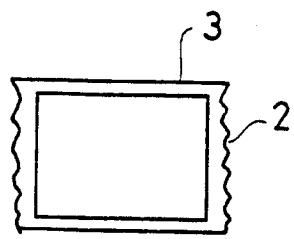
FIG. 3 is an enlarged view showing a chip separated in FIG. 2A and 2B.
Figure 4:
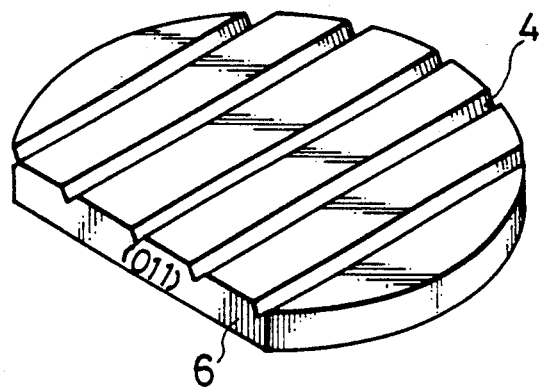
FIG. 4 is a plan view showing dicing lines formed on a wafer of III-V semiconductor material when the diamond scribing method is used according to the present invention.
Figure 5:
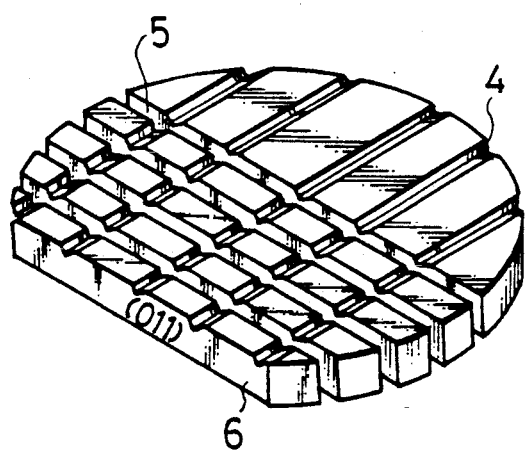
FIG. 5 is a plan view showing dicing lines formed on the wafer of III-V semiconductor material by the diamond scribing method, and grooves cut through by the diamond blade method according to the present invention.

Referring to FIG. 4 and FIG. 5, an embodiment of a method for dicing a wafer of a III-V compound semiconductor material will be described in detail.

For example, suppose that GaAs is used for the wafer of the III-V compound semiconductor. A GaAs epitaxial layer grows on the GaAs substrate and a plurality of semiconductor lasers and FET's and so on are fabricated in the wafer. Then the wafer is separated into a plurality of chips by a dicing process. The semiconductor wafer with the III-V compound epitaxial layer deposited thereon is a very expensive one among the wafers of the III-V compound semiconductor material. Therefore, it is required to use the material most efficiently.

The semiconductor laser and FET and so on are fabricated on the epitaxial layer of III-V compound having the width of some thousands Angstroms, and a plurality of passive and active elements are completed thereon. Between the elements, dicing lines are formed by, for instance, a diffusion means in the directions of X- and Y-axes.

A groove of cut is formed onto the dicing lines, of which width is 30 μm through 50 μm, by means of a diamond scribing method or diamond blade method. The depth of the groove is determined in consideration of how much debris will be after forming the groove of cut. Since the groove of cut is formed at a rather shallow depth, it will be often referred to as a track hereinafter.

An orientation flat 6 is provided in a wafer of III-V compound as shown in FIG. 4. The orientation flat practically indicates the crystal plane of strongest cleavage, which is shown as (011) in FIG. 4 and FIG. 5. Referring to FIG. 4, the dicing lines 4 formed orthogonal to the orientation flat (011) is given tracks by the diamond scribing method.

Then, referring to FIG. 5, the dicing lines 5 formed parallel to the orientation flat (011) is given tracks by the diamond cutter and is cut through by moving the diamond blades. Then, the tracks orthogonal to the orientation flat (011) will be cut through to obtain separated chips.

In the course of the dicing process, when the shape of the chips is rectangular, the longer side of the rectangular chips is usually placed along the scribe lines parallel to the orientation flat (011). In a semiconductor wafer of III-V compound having a second orientation flat orthogonal to the first orientation flat (011), the dicing is usually carried out based on the first orientation flat of (011).

Namely, first, tracks are provided orthogonal to the cleavage (011) by the diamond scribing method. Secondly, the dicing will be carried out to be cut through along the tracks parallel to the cleavage (011), the tracks being provided by the diamond blade method. Then pressure will be applied by a rubber roller onto the wafer to separate the wafer into chips. As for the rubber roller or the like, the rubber or elastic body is usually attached around the roller which is freely rotatably supported by a supporting member. As a typical case, the dimension of the roller is greater than 0.3 mm and is also greater in length than the shorter side of chip rectangular. It should be appreciated that the dicing saw method may be used in place of the diamond blade method. It is to be noted that a square-shaped chip may be used instead of the regular rectangular one.

In summary, in order to optimize the yield, there is provided a method of dicing a wafer of a III-V compound semiconductor material, combining the diamond scribing method and the diamond blade method, as well as combining the diamond scribing method and the dicing saw method. There is also a significance in the improvement of efficiency in wafer material consumption where the chipping and cracks are prevented by adopting the methods according to the present invention, particularly in view of the fact that the wafer of the III-V compound semiconductor material is comparatively costly as a raw material and weak in strength as compared with silicon.

Besides those already mentioned above, many modifications and variations of the above embodiments may be made without departing from the novel and advantageous features of the present invention. Accordingly, all such modifications and variations are intended to be included within the scope of the appended claims.

What is claimed is:

1. A method for dicing a wafer of III-V compound semiconductor material, the method comprising the steps of:

forming a scribe line on a surface of the wafer orthogonal to a crystal plane (011) by means of a scribing method;

forming a groove in the semiconductor wafer in parallel to the crystal plane (011) by means of a grinding-cutting method; and breaking the semiconductor wafer along the scribe line and the groove.

2. The method of claim 1, wherein the grinding-cutting method uses a blade means for forming the groove in the semiconductor wafer.

3. The method of claim 1, wherein the grinding-cutting method uses a wire saw means for forming the groove in the semiconductor wafer.

4. In a method for dicing a wafer of III-V compound semiconductor material, the method comprising two distinct steps for forming a scribe line and a groove in the semiconductor material, comprising the steps of:

forming a scribe line on a surface of the wafer orthogonal to a crystal plane (011) by means of a scribing method;

forming a groove in the semiconductor wafer in parallel to the crystal plane (011) by means of a grinding-cutting method; and breaking the semiconductor wafer along the scribe line and the groove.

5. The method of claim 4, wherein the grinding-cutting method uses a blade means for forming the groove in the semiconductor wafer.

6. The method of claim 4, wherein the grinding-cutting method uses a wire saw means for forming the groove in the semiconductor wafer.

7. A method for dicing a wafer of III-V compound semiconductor material, the method comprising the steps of:

forming a scribe line on a surface of the wafer orthogonal to a crystal plane (011) by means of a scribing method;

cutting through the semiconductor wafer in grooves parallel to the crystal plane by means of a grinding-cutting method; and breaking the semiconductor wafer along the scribe line.

8. The method of claim 1, wherein the grinding-cutting method uses a blade means for further cutting through the semiconductor wafer.

9. The method of claim 1, wherein the grinding-cutting method uses a wire saw means for further cutting through the semiconductor wafer.

* * * * *